United States Patent [19]
Miura

[11] Patent Number: 5,436,202
[45] Date of Patent: Jul. 25, 1995

[54] METHOD AND APPARATUS FOR HERMETICALLY SEALING SEMICONDUCTOR PACKAGE

[75] Inventor: Shinya Miura, Hadano, Japan

[73] Assignee: Hitachi, Ltd., Tokyo, Japan

[21] Appl. No.: 851,398

[22] Filed: Mar. 11, 1992

[30] Foreign Application Priority Data

Mar. 15, 1991 [JP] Japan .................. 3-075596

[51] Int. Cl.⁶ .................................. H01L 21/60
[52] U.S. Cl. ................................ 437/209; 437/214;
437/215; 437/219; 437/220; 229/124.6;
229/121
[58] Field of Search ............. 437/209, 218, 214, 215,
437/216, 220, 222; 29/25.03; 228/5.1, 9, 121,
124.6, 219

[56] References Cited

U.S. PATENT DOCUMENTS

| | | | |
|---|---|---|---|
| 4,355,463 | 10/1982 | Burns | 437/218 |
| 4,426,769 | 1/1984 | Grabbe | 437/218 |
| 4,764,804 | 8/1988 | Sahara et al. | 437/209 |
| 4,836,434 | 6/1989 | Takenaka et al. | 228/121 |
| 4,974,769 | 12/1990 | Mizuishi | 228/124.6 |

FOREIGN PATENT DOCUMENTS 61-276237 12/1986 Japan .
63-299255 12/1988 Japan .

Primary Examiner—Brian E. Hearn
Assistant Examiner—Kevin M. Picardat
Attorney, Agent, or Firm—Fay, Sharpe, Beall, Fagan, Minnich & McKee

[57] ABSTRACT

In a gas pressure controlled processing chamber, a semiconductor package is enclosed by a heater and is heated extensively (or in a full-face way) up to a predetermined temperature equal to or higher than a fusing point of pre-solder bumps applied on bonding portions of a substrate and a cap of the semiconductor package in a state in which the bonding portions are separated from each other. After the predetermined temperature has been reached, the bonding portions are brought into abutment. In the abutting state of the bonding portions, a gas pressure in the processing chamber is controlled and the semiconductor package is cooled. The control of the gas pressure in the processing chamber is made by successively measuring a temperature of the semiconductor package and determining a control target value of the gas pressure in accordance with the measured temperature value. By this gas pressure control, a solder fillet profile is corrected.

21 Claims, 6 Drawing Sheets

FIG. 6A "LOCAL" MODE

FIG. 6F "REMOTE" MODE

COOLING DOWN TO TEMPERATURE AT WHICH HANDLING IS POSSIBLE

| SEQUENCE | OPERATION | EXPLANATORY ILLUSTRATION |
|---|---|---|
| (i) | OPEN CHAMBER (RAISE COVER OF CHAMBER) |  |
| (ii) | MOVE CARRIER ARM FORWARD |  |
| (iii) | RAISE PUSH PIN HOLD WORK |  |
| (iv) | MOVE CARRIER ARM BACKWARD |  |
| (v) | LOWER PUSH PIN SET WORK IN LOWER HEATER |  |
| (vi) | OPEN (LOWER COVER OF CHAMBER) SET UPPER HEATER |  |

METHOD AND APPARATUS FOR HERMETICALLY SEALING SEMICONDUCTOR PACKAGE

BACKGROUND OF THE INVENTION

The present invention relates to a method and apparatus for hermetically sealing a semiconductor package, and more particularly to such a method and apparatus in which a semiconductor package having a semiconductor device such as an LSI chip or the like mounted on a ceramic substrate or the like is hermetically sealed with solder being used as a sealing material.

In a semiconductor package having such a high packing density that it is difficult to sufficiently ensure a sealing area by a gasket, a method is advantageous in which a substrate having a semiconductor device mounted thereon and a cap are hermetically sealed by solder bonding. In this sealing method, the prevention of the inflow of a sealing solder into the package and the generation of defects such as pin holes or the like, as well as the control of the amount (or height) and the shape (fillet profile) of the sealing solder, are important in an aspect of the sealing performance.

JP-A-61-276237 has disclosed a method and apparatus in which a semiconductor package is hermetically sealed in a gas pressure controlled chamber in such a manner that in a state in which priming solders (or pre-solders) applied on bonding portions of a substrate and a cap of the semiconductor package are heated and fused by a heater provided in the vicinity of the bonding portions, the substrate and the cap are brought in proximity to each other so that a distance between both the bonding portions becomes smaller than a desired value and the fused solders contact each other, the substrate and the cap are thereafter moved in reverse directions to bring the distance between the bonding portions to the desired value, and the solders at the bonding portions are cooled and solidified by lowering the heater temperature in a state in which the distance between the bonding portions is kept at the desired value. A gas pressure in the chamber is reduced with the progression of cooling so that a balance between a gas pressure in the semiconductor package and the gas pressure in the chamber is held until the solder at the bonding portion is solidified.

JP-A-63-299255 has disclosed a sealing apparatus in which the sealing is performed in a gastight chamber in such a manner that a semiconductor package is placed on a plate-like heating/cooling device and is heated and cooled by the plate-like heating/cooling device to fuse and solidify a sealing material (or solder) with a pressure in the gastight chamber being increased or decreased in accordance with the heating or cooling temperature of the heating/cooling device so that the gas pressures inside and outside the semiconductor package become the same.

SUMMARY OF THE INVENTION

An object of the present invention is to provide a sealing method and apparatus which can hermetically seal a semiconductor package with excellent gastightness.

Another object of the present invention is to provide a sealing method and apparatus which can hermetically seal a large-sized semiconductor package by solder with improved reliability.

In a process of sealing a substrate and a cap of a semiconductor package by solder, a range of temperatures at the time of sealing is determined from aspects of the reflowability of solder, the protection of a mounted device from thermal damage, and so on, but it is experimentally recognized that it is necessary to suppress a variation in temperature distribution on a substrate surface to a value within about ±3° C. However, in the method of the JP-A-61-276237 in which the solder at the bonding portion is heated from a side surface by the heater provided around the bonding portion, or the method of the JP-A-63-299255 in which the semiconductor package is heated from a lower surface side by the plate-like heating/cooling device, it is difficult to provide the temperature distribution within ±3° C. Especially, in the case of a large-sized semiconductor package having a multiplicity of LSI chips mounted on a ceramic substrate, uniform heating with such a temperature distribution is impossible, for example, since the warpage of the substrate is large.

In the prior art disclosed by the JP-A-61-276237, the sealing process includes a distance adjustment operation which uses a servo mechanism for making a relative movement between the substrate and the cap so that a distance between the substrate and the cap is once reduced to a value smaller than the desired value and is thereafter brought into the desired value. Though it is necessary to perform this minute distance adjustment with high precision since it has a direct influence on the amount (or height) and shape of solder after sealing, the provision of a distance detecting sensor in proximity to the bonding portion is indispensable for that purpose and hence a structure surrounding the bonding portion becomes inevitably complicated. Further, in the case of a large-sized semiconductor package, a required distance adjustment with high precision is very difficult since influences such as the warpage of the substrate are not negligible. The JP-A-63-299255 discloses neither the control of a distance between the substrate and the cap nor the control of the shape of solder after sealing.

The above-mentioned gas pressure control in the sealing process is made on the premise that it is possible to accurately determine a gas pressure inside a semiconductor package and a gas pressure outside the semiconductor package (or a gas pressure in a chamber). Though the gas pressure in the chamber can be detected by disposing a pressure sensor in the chamber, it is not easy and not preferable in general to incorporate a pressure sensor in the semiconductor package. Both the JP-A-61-276237 and the JP-A-63-299255 have no clear disclosure of a method of determining the gas pressure in the semiconductor package or only teaches increasing or decreasing the pressure in the chamber on the basis of the heating/cooling temperature of the heater or heating/cooling device so that the gas pressures inside and outside the package are balanced. This disclosure is considered as being made on the assumption that a gas pressure and a temperature in the semiconductor package have a fixed relation therebetween.

However, the heating or cooling temperature of the heater or the heating/cooling device having a configuration as shown by the JP-A-61-276237 or the JP-A-63-299255 does not coincide with the temperature of the semiconductor package. Especially, in the case of a large-sized semiconductor package, a difference between the heating temperature of the heater or the heating/cooling device as well as a variation in package temperature distribution increases. Therefore, it is difficult to realize high-precision control of the gas pressure in the chamber in accordance with the prior art taught by the JP-A-61-276237 and the JP-A-63-299255. There may be considered a method of measuring a temperature of the semiconductor package by a temperature sensor provided inside or outside the semiconductor package and controlling a gap pressure in the chamber by use of the measured temperature value. However, according to this method too, the realization of a gas pressure control with high precision is difficult when a variation in package temperature distribution is large, as mentioned above.

An object of the present invention is to provide a semiconductor package hermetic-sealing method and apparatus which is capable of solving the various problems mentioned above, or more particularly to provide a semiconductor package hermetic-sealing method and apparatus in which the reliability of solder sealing can be ensured even in the case where the size of a semiconductor package is large. More especially, this object of the present invention is achieved by a method and apparatus in which the hermetic sealing of high performance can be attained with an optimized shape of sealing solder by making the temperature of a semiconductor package uniform during a sealing process, keeping a distance between sealing portions at a desired value with high precision and controlling a gas pressure in a chamber with high precision.

To that end, according to a sealing method of the present invention, in a gas pressure controlled processing chamber, a semiconductor package including a substrate and a cap is enclosed by heating means and is heated by the heating means up to a predetermined temperature equal to or higher than a fusing or melting point of pre-solders applied on bonding portions of the substrate and the cap of the semiconductor package in a state in which the bonding portions are separated from each other. After a temperature of the semiconductor package has reached the predetermined temperature, the bonding portions are brought into abutment. In the abutting state of the bonding portions, the control of a gas pressure in the processing chamber and the cooling of the semiconductor package are performed.

The control of the gas pressure in a processing chamber is made by determining a control target value of a gas pressure in the processing chamber in accordance with a temperature of the semiconductor package successively measured. More particularly, the gas pressure in the processing chamber is controlled by determining the control target value of a gas pressure in the processing chamber by use of a temperature of the semiconductor package and a gas pressure in the processing chamber measured immediately before abutment, by determining the control target value of a gas pressure in the processing chamber by use of a temperature of the semiconductor package successively measured, a temperature of the semiconductor package measured immediately before abutment and the value of addition of a gas pressure in the processing chamber measured immediately before abutment and a pressure offset value for correction of the shape of solder at the bonding portions, or by determining the control target value of a gas pressure in the processing chamber by use of a preset constant value which corresponds to the ratio of a gas pressure in the processing chamber immediately before abutment or the value of addition of that gas pressure and a pressure offset value to a temperature of the semiconductor package immediately before abutment and a temperature of the semiconductor package, which is successively measured after abutment.

The above-mentioned sealing method of the present invention can be performed by a semiconductor package hermetic-sealing apparatus according to the present invention which comprises a processing chamber for a process of sealing, a mechanism for holding a substrate and a cap of a semiconductor package in the processing chamber in a state in which bonding portions of the substrate and the cap are separated from each other or in a state in which they abut against each other, means enclosing the semiconductor package held by the holding mechanism for heating the semiconductor package, means for controlling a heating temperature of the heating means, a temperature sensor for measuring a temperature of the semiconductor package held by the holding mechanism, a pressure sensor for measuring a gas pressure in the processing chamber, means for making the supply and exhaustion of a gas into and from the processing chamber, and means for adjusting the supply and exhaustion of the gas by the gas supplying and exhausting means in accordance with the value of measurement by the temperature sensor and the value of measurement by the pressure sensor to control the gas pressure in the processing chamber.

As has already been mentioned, a variation in package temperature distribution at the time of sealing should be suppressed from aspects of the reflowability of solder, the protection of a mounted device from thermal damage, and so on in order to attain satisfactory solder sealing. According to the present invention, it is possible to sufficiently suppress the variation in temperature distribution by the extensive (or full-face) and uniform heating of the semiconductor package by the heating means enclosing the semiconductor package, even if the semiconductor package is of a large size.

Also, in the present invention, a temperature of the semiconductor package is measured, and the measured temperature or both the measured temperature and a gas pressure in the processing chamber are used for determining the control target value of a gas pressure in the processing chamber. Therefore, it is possible to realize a gas pressure control which is more precise as compared with the conventional method using the heating or cooling temperature of the heater or the heating/cooling device. Further, according to the present invention, since the variation in semiconductor package temperature distribution is suppressed, as mentioned above, it becomes possible to measure the temperature of the semiconductor package with satisfactory precision by use of a temperature sensor incorporated in the semiconductor package, a temperature sensor brought into contact with the surface of the substrate or the cap from the exterior, or a non-contact surface temperature sensor, and hence the deterioration of the gas pressure control precision due to an error in measurement can be prevented.

Furthermore, the present invention employs an abutting method or a method in which the bonding portions of the substrate and the cap of the semiconductor package are brought into abutment so that a distance between both bonding portions is defined by the height of a projection provided on one or both of the bonding portions. Therefore, it is possible to control the distance between the bonding portions (equal to the height of the solder) with high precision, for example, even in the case where the sealing is made for a large-sized semiconductor package using as a substrate a ceramic substrate which has a large warpage. Also, in the present invention, a correction of the shape of the sealing solder is made after abutment of the bonding portions through the control of the gas pressure in the processing chamber. Therefore, it is possible to realize a fillet profile which is proper for ensuring the performance of sealing.

As mentioned above, satisfactory hermetic sealing can be attained according to the present invention, even in the case of a large-sized semiconductor package. A more detailed explanation of the control of the gas pressure in the processing chamber will now be made.

Provided that a gas concerned is an ideal gas and the internal volume of a semiconductor package is kept constant, a gas pressure P in the semiconductor package and a temperature T of the semiconductor package have the relation of $$P/T = \text{constant} \tag{1}$$

from the Boyle-Charles' law. Accordingly, provided that a gas pressure in the package immediately before abutment of the bonding portions of the substrate and the cap (which is identical to a gas pressure in the processing chamber at that time) is $P_0$ and a temperature of the package at that time is $T_0$ (°C.), a gas pressure $P_1$ after abutment at a temperature $T_1$ (°C.) can be determined from the following equation:

$$P_1 = P_0(T_1 + 273)/(T_0 + 273). \tag{2}$$

Namely, in the case where a gas pressure in the processing chamber upon abutment is stabilized with sufficient precision, a gas pressure in the semiconductor package can be calculated from a temperature of the semiconductor package. However, the equation (2) holds for the case where the volume of the package before and after abutment is the same. Actually, since the volume of the package further decreases after fused solders on the bonding portions have joined with each other through abutment, the fused solder on the bonding portion swells toward the outside. At that time, a balance in pressure is kept in the relation of (gas pressure in package) = (gas pressure in processing chamber) + (internal pressure of fused solder).

Such an increment of the gas pressure in the package to cause the outside swelling of the solder is not taken into consideration by the equation (2). Therefore, if the gas pressure ($P_1$) in the package calculated in accordance with the equation (2) is taken as a control target value to control the gas pressure in the processing chamber, the solder will exhibit an outward swollen profile. Such an outwardly swollen fillet profile is improper since a solder layer having a fixed or uniform width (or thickness) is required at the bonding portion in order to ensure the reliability of sealing. The increment in gas pressure causing the solder swelling is predictable with considerable precision. Therefore, according to the present invention, the shape of the solder is corrected into a proper profile by the control of the gas pressure in the processing chamber after abutment.

According to one aspect of the present invention, a proper fillet profile with a corrected shape of solder is realized in such a manner that a value determined on the basis of the following equation (3) obtained by introducing a proper pressure offset value $\Delta P$ for correction of the solder shape into the above equation (2) is taken as a control target value of a gas pressure in the processing chamber:

$$P_1 = (P_0 + \Delta P)(T_1 + 273)/(T_0 + 273). \tag{3}$$

In the case where there are variations in temperature of the semiconductor package and in the gas pressure in the processing chamber at a process step in which the temperature measurement and the pressure measurement before abutment (preferably, immediately before abutment) are made, an influence is given on the control target value calculated in accordance with the equation (3). If this influence is eliminated, the precision of the control of a gas pressure in the processing chamber after abutment can be further improved. For that purpose, it is preferable that the control target value can be set independently from the actually measured values of a temperature of the semiconductor package and a gas pressure in the processing chamber before abutment.

Thus, according to another aspect of the present invention, since $P_0$, $\Delta P$ and $T_0$ in the equation (3) take constant values if temperature and gas pressure conditions before abutment are fixed, a control target value of a gas pressure in the processing chamber is calculated by the following equation:

$$P_1 = C(T_1 + 273) \tag{4}$$

where $$C = (P_0 + \Delta P)/(T_0 + 273).$$

Here, C is beforehand set as a constant value and the control target value of the gas pressure in the processing chamber is determined by the multiplication of a temperature of the semiconductor package after abutment and the constant value C. Consequently, it is possible to eliminate the influence of variations in temperature and gas pressure upon temperature measurement and pressure measurement before abutment, thereby attaining an improvement in precision of gas pressure control.

Incidentally, experiments performed in conjunction with embodiments described later on have revealed that a variation in gas pressure in the processing chamber immediately after abutment for the variation of $\pm 2$ (Torr) in gas pressure in the processing chamber immediately before abutment is about $\pm 5$ (Torr) when the equation (3) is used and about $\pm 2$ (Torr) when the equation (4) is used. It can be understood that such a large difference is produced because variations in temperature and gas pressure before abutment are reflected in the result of calculation in the case of the equation (3) as they are, as has already been mentioned, and influences such as bit dropout error through analog-to-digital conversion upon taking-in of measured data and superimposed noises are added. In other words, the method based on the equation (4) is also advantageous for the purpose of minimizing the influences such as bit dropout error upon taking-in of data and noise. A proper equation modified can be used in lieu of the equation (2), (3) or (4) for determining the control target value.

As is apparent from the foregoing explanation, in the present invention, the uniform heating of the semiconductor package and the temperature measurement with high precision become possible by heating the semiconductor package extensively (or in a full-face way). Also, a gas pressure control with high precision becomes possible by determining the control target value of a gas pressure in the processing chamber by use of the measured value of a temperature of the semiconductor package, or that temperature value and the measured value of a gas pressure in the processing chamber. Further, for example, even in the case where a large-sized semiconductor package in which a ceramic substrate having a large warpage is used as a substrate, control of a distance between bonding portions (or the height of solder) with high precision becomes possible by employing a method in which the bonding portions of the substrate and the cap of the semiconductor package are brought into abutment. Furthermore, since a solder fillet profile is corrected by controlling a gas pressure in the processing chamber at the time of fusing of sealing solder, gas-filled hermetic sealing of high performance is attainable even for a large-sized semiconductor package in which the warpage of a substrate is not negligible.

DESCRIPTION OF THE PREFERRED EMBODIMENTS

Embodiments of the present invention will now be explained by virtue of the accompanying drawings.

Figure 3:
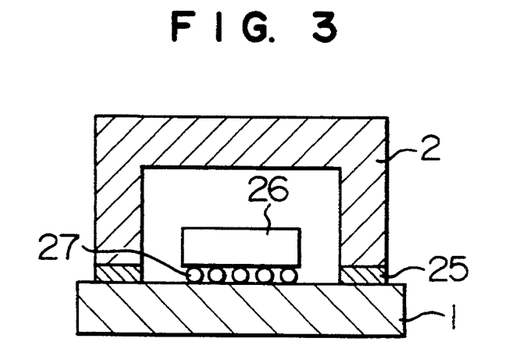
FIG. 3 is a schematic cross section showing the structure of the cross section of a semiconductor package.

In an embodiment of the present invention, a semiconductor package to be processed includes a substrate 1 and a cap 2, as shown in FIG. 3. The substrate 1 and the cap 2 are mechanically bonded by means of sealing solder 25 so that the semiconductor package is hermetically sealed. The substrate 1 includes a ceramic substrate or the like. A semiconductor device 26 such as as an LSI chip is mounted on the substrate 1 by means of bonding solder 27.

Figure 4:
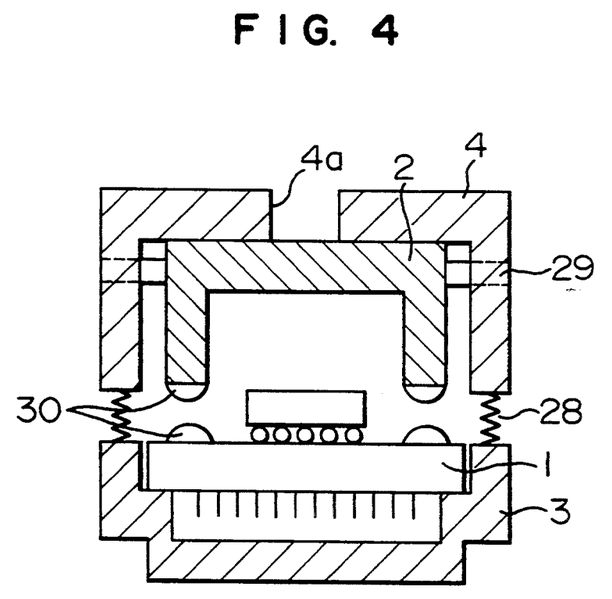
FIG. 4 is a schematic cross section showing the structure of a jig in which a semiconductor package is set.

Prior to a hermetic sealing process, pre-solder bumps 30 (see FIG. 4) are applied onto bonding portions (or abutting portions) of the substrate 1 and the cap 2 of the semiconductor package and cleaning is made for removing residual flue. A projection of a predetermined height for defining a distance between the bonding portions after sealing is provided on one or both of the bonding portions of the cap 4 and the substrate 1, though the projection is lost in the pre-solder bump 30 in FIG. 4. The projection is made of a metal or the like which is not melted by the heat used for the solder sealing. As shown in FIG. 4, the substrate 1 and the cap 2 are set in a jig divided into lower and upper jigs 3 and 4, and the cap 2 is clamped from both sides thereof by means of fixing screws 29 so that it is fixed to the upper jig 4. The jigs 3 and 4 are held in a separated state by virtue of the action of a spring 28, as shown in FIG. 4, so that a fixed distance is ensured between the bonding portions of the substrate 1 and the cap 2.

Figure 1:
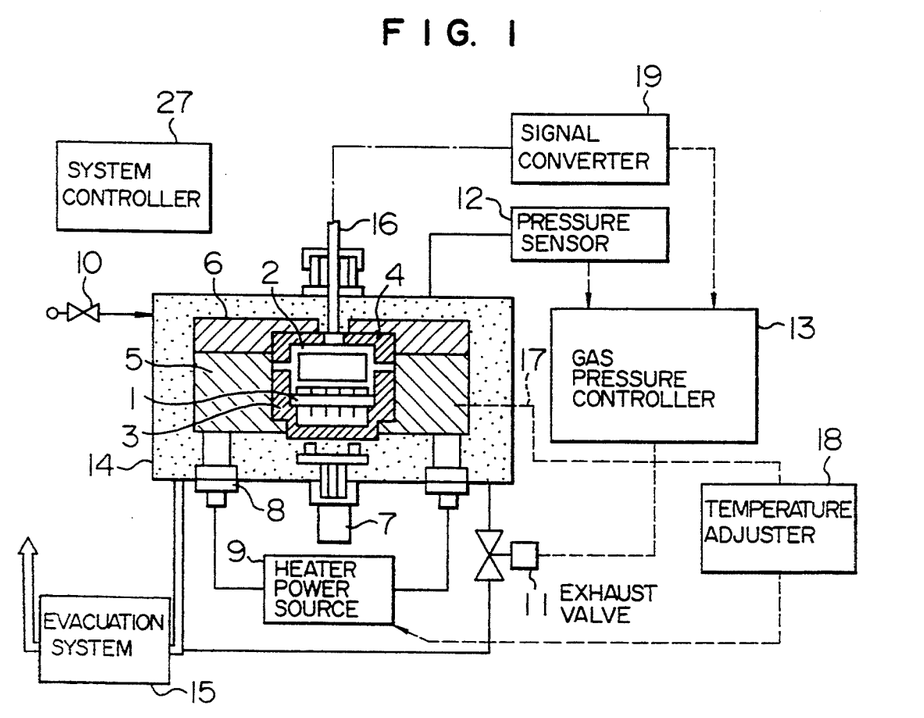
FIG. 1 is a schematic view showing the construction of an example of a semiconductor package hermetic-sealing apparatus together with a control system.

FIG. 1 schematically shows the construction of a semiconductor package hermetic-sealing apparatus according to the present invention. Jigs 3 and 4 having a substrate 1 and a cap 2 of a semiconductor package set therein, as shown in FIG. 4, are set in a heater divided into lower and upper heaters 5 and 6 provided in a processing chamber 14. The heater 5 has an opening provided at a position facing a part of a lower surface of the jig 3 and the heater 6 has an opening provided at a position facing a hole 4a (see FIG. 4) of the jig 4. Even if such openings are partially provided in the heaters 5 and 6, the semiconductor package may be regarded as being thermally enclosed by the heaters 5 and 6 extensively (or in a substantially full-face way). A current for heating the heaters 5 and 6 is supplied through electrodes 8 from a heater power source 9.

A pushing mechanism 7 is provided opposite to the opening of the heater 5. The pushing mechanism 7 has a function of pushing up the jig 3 when the bonding portions of the substrate 1 and the cap 2 of the semiconductor package are to be brought into abutment. Reference numeral 16 designates a temperature sensor for measuring a surface temperature of the cap 2. A tip of the temperature sensor 16 contacts the cap 2 through the opening of the heater 6 and the hole 4a of the jig 4. A non-contact type surface temperature sensor may be used as the temperature sensor 16. Numeral 17 designates a temperature sensor for measuring a temperature of the heater 5. Numeral 18 designates a temperature adjuster which adjusts a heater heating current through the heater power source 9 so that a heater temperature measured by the temperature sensor 17 is kept at a target temperature.

Numeral 10 designates a supply valve for controlling the supply of a gas to the processing chamber 14, numeral 11 an exhaust valve for controlling the exhaustion of a gas from the processing chamber 14, and numeral 15 an evacuation system for evacuating the processing chamber 14. Numeral 12 designates a pressure sensor for measuring a gas pressure in the processing chamber 14. Numeral 13 designates a gas pressure controller which adjusts the exhaust valve 11 to control the gas pressure in the processing chamber 14. A detection output of the pressure sensor 12 is inputted directly to the gas pressure controller 13. A detection output of the temperature sensor 16 after conversion thereof by a signal converter 19 into digital data is also inputted to the gas pressure controller 13. The output of the temperature sensor 16 may be processed as an analog signal. In that case, necessary level conversion is made by the signal converter 19.

In lieu of a detection output of the temperature sensor 17 for adjustment of heater temperature or current, a detection output of the temperature sensor 16 for measurement of semiconductor package temperature may be inputted to the temperature adjuster 18, in order to control the temperature of the semiconductor package with higher precision. In this case, it is preferable that a signal converter for avoiding interference between the temperature adjuster 18 and the gas pressure controller 13 is interposed between the temperature sensor 16 and the temperature adjuster 18. The sequence of the whole of the sealing process is controlled by a system controller 27.

Figure 2:
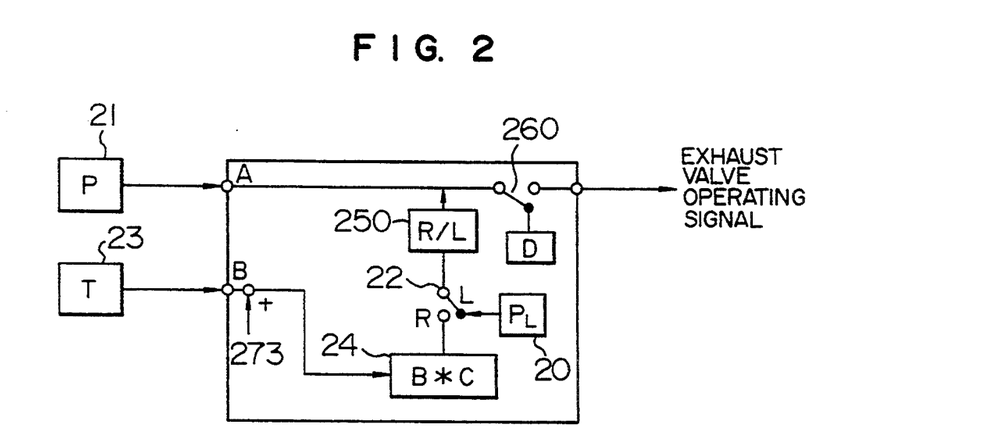
FIG. 2 is a schematic block diagram showing an example of a gas pressure controller.

FIG. 2 shows the internal construction of the gas pressure controller 13. The illustration shown here as one example is made in conjunction with the case where a control target value of a gas pressure in the processing chamber is set in accordance with the above equation (4). In FIG. 2, reference numeral 21 designates the measured value of a gas pressure in the processing chamber which is supplied from the pressure sensor 12. Numeral 23 designates the measured value of a temperature of the semiconductor package which is supplied from the signal converter 19. The temperature of the semiconductor package is measured in units of degrees centigrade. Therefore, the measured value 23 is inputted to a multiplier 24 after addition of a bias value (=273) for conversion into an absolute temperature and is multiplied by the constant value C (see the equation (4)) in the multiplier 24. In a "REMOTE" mode, a switch 22 is turned to the R side so that an output value of the multiplier 24 is supplied as the gas pressure control target value to a comparator 250. In a "LOCAL" mode, the switch 22 is turned to the L side so that a set value of a setter 20 is supplied as the control target value to the comparator 250. The "LOCAL" mode is a mode for gas pressure control before abutment of the bonding portions of the substrate and the cap of the semiconductor package and the "REMOTE" mode is a mode for gas pressure control after abutment. The comparator 250 compares the measured value 21 of gas pressure and the control target value to output an exhaust valve operating signal for minimizing a difference between both the values. This signal is supplied through a switch 260 to the exhaust valve 11.

Figure 5:
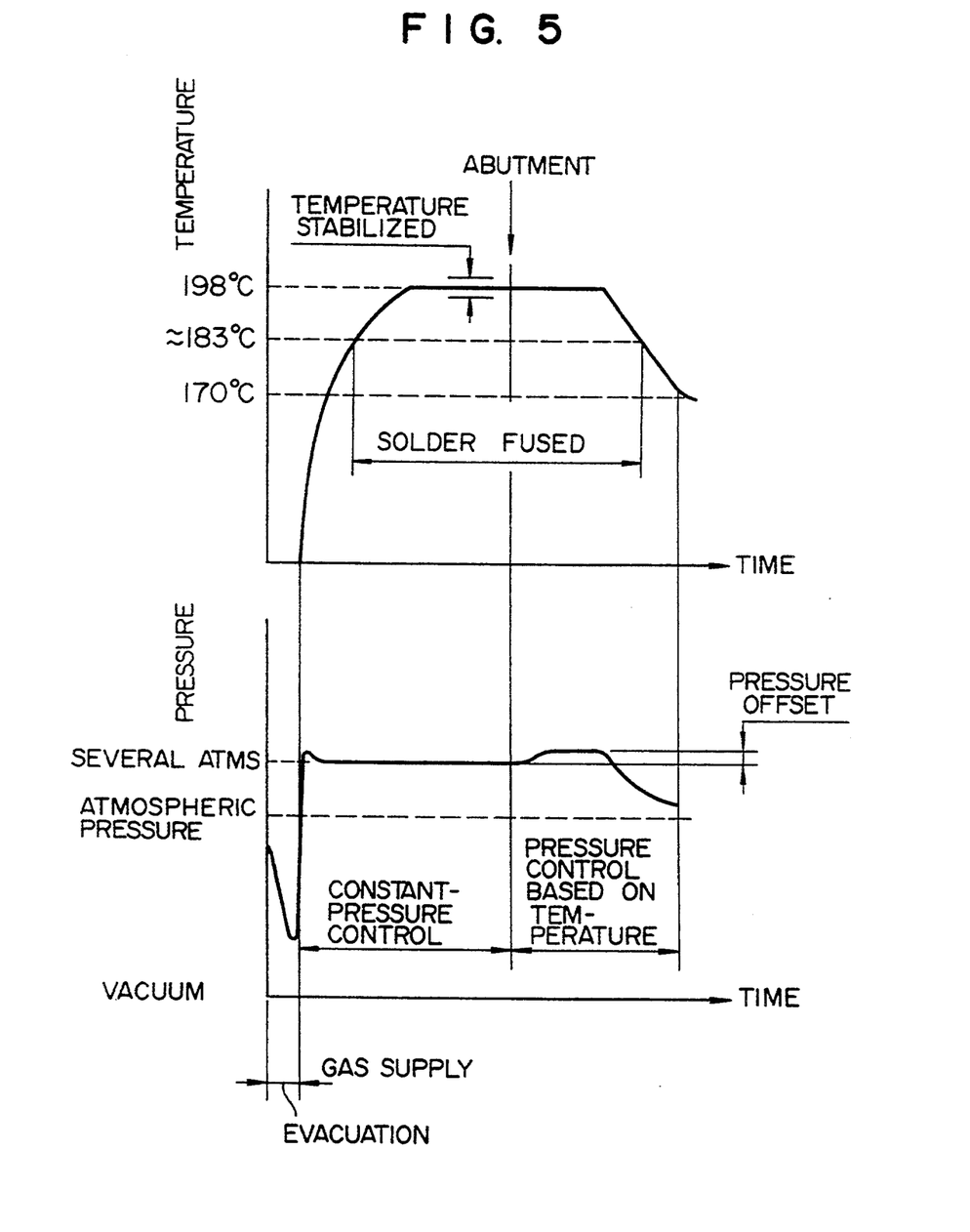
FIG. 5 is a time chart for explaining an example of a sealing process.

Next, the details of the sealing process will be explained. FIG. 5 is a time chart for explaining the outline of the process.

The process is started after the jigs 3 and 4 having the, semiconductor package set therein have been set in the, heaters 5 and 6, as shown in FIG. 1. In this stage of time, since the pushing mechanism 7 is not operated, the bonding portions of the substrate 1 and the cap 2 are held in a separated state, as shown in FIG. 4.

The evacuation system 15 is controlled by the system controller 27 so that the processing chamber 14 is evacuated to a high degree of vacuum. This evacuation is made for ensuring the purity of a filler gas. In the case where the amount of gas evolution from the semiconductor package is large, it is required for assurance of the purity of the filler gas that the evacuation is continued for a time longer than a certain time in a state in which the semiconductor package is heated at a temperature free from a fear of thermal damage of the semiconductor package. At this step of time, since the switch 260 in the gas pressure controller 13 is opened (or turned to the lower side in FIG. 2), a gas pressure control function is suppressed and the exhaustion valve 11 remains closed.

When the interior of the processing chamber 14 reaches a predetermined degree of vacuum, a predetermined temperature control target value is set to the temperature adjuster 18 by the system controller 27 and the switch 260 in the gas pressure controller 13 is closed while the switch 22 is set to the "LOCAL" mode side. Also, the supply valve 10 is opened by the system controller 27 so that an inert gas as the filler gas is supplied into the processing chamber 14 with an increasing pressure in the processing chamber 14. At this time, the gas pressure controller 13 operates in the "LOCAL" mode to open/close the exhaust valve 11 so as to stabilize the gas pressure in the processing chamber 14 to a control target value set by the setter 20. The supply valve 10 is kept in the opened state and the gas supply amount is made constant by a mass flow controller or the like in order that the gas pressure in the processing chamber 14 is smoothly changed with no ripple caused by the valving operation. Also, the current of the heaters 5 and 6 is controlled by the temperature adjuster 18 so that the heating temperature is stabilized at the control target value. As a result, the temperature of the semiconductor package is also stabilized at a predetermined value (a temperature equal to or higher than a fusing point of the sealing solder). Since the semiconductor package is enclosed and heated by the heaters 5 and 6 extensively or in a substantially full-face way, it is possible to make a variation in temperature distribution thereof very small. Accordingly, the temperature of the semiconductor package can be measured by the temperature sensor 16 with high precision.

At a stage of time when the gas pressure in the processing chamber and the temperature of the semiconductor package have been stabilized and the pre-solder 30 has sufficiently been fused, the pushing mechanism 7 is operated by the system controller 27 so that the pushing mechanism 7 pushes up the jig 3 against a force of the spring 28 to hold the bonding portions of the substrate 1 and the cap 2 in an abutting state. A distance defined by the projection(s) provided on one or both of the bonding portions is ensured between the bonding portions. Also, the switch 22 in the gas pressure controller 13 is changed over to the "REMOTE" side by the system controller 27 so that the gas pressure in the processing chamber 14 is controlled at the control target value calculated in accordance with the above equation (4). At this time, the gas pressure in the processing chamber 14 is increased by a predetermined pressure offset value ($\Delta P$), as shown in FIG. 5, in order to correct the shape of solder swollen toward the outside due to the abutment. Showing a numerical example, when $P_0 = 975$ (Torr), $\Delta P = 0$ (Torr) and $t_0 = 198$ (°C.), C is 2.07 (Torr/deg).

At a point when a time necessary for the correction of the shape of the solder by the pressure offset and the conformation of fused solder has elapsed, the temperature adjuster 18 is instructed to stop or lower of the heating temperature with a predetermined gradient instructed by the system controller 27 so that the power supply from the heater power source 9 to the heaters 5 and 6 is cut off or the value of the heating current is decreased, thereby cooling the semiconductor package. At a point of time when the temperature of the semiconductor package has been lowered sufficiently to solidify the sealing solder, the operation of the pushing mechanism 7 is stopped by the system controller 27. (If the pushing mechanism 7 is not of an automatic return structure, a change-over to a return side is made.) As a result, the jigs 3 and 4 are returned to a state shown in FIG. 4 by virtue of the action of the spring 28, thereby completing a gas-filled, hermetically-sealed semiconductor package.

It is also possible to determine a control target value of the gas pressure in the processing chamber by the gas pressure controller 13 in accordance with the above equation (3). In this case, the construction shown in FIG. 2 can be used in a manner that means for calculating the constant C of the equation (4) by use of the measured values of a gas pressure and a temperature immediately before abutment and storing the calculated constant value is additionally provided and the constant value is used in the multiplier 24. However, such a construction is only one example. Further, the above equation (2) can be used. In this case, the correction of the shape of the solder is similarly made in such a manner that the value of addition of a proper pressure offset value to the value of calculation by the equation (2) is used as a control target value, the calculation of the equation (2) is performed after the addition of a proper pressure offset value to the measured value of a gas pressure immediately before abutment to determine a control target value, or the value of multiplication of the calculation value of the equation (2) by a proper correction factor is used as a control target value.

A gas pressure control similar to that by the gas pressure controller 13 can be realized easily by software using a conventional personal computer. In that case, the measured values of a temperature of the semiconductor package and a gas pressure in the processing chamber are entered into the personal computer through an analog-to-digital converter and an I/O interface circuit and are stored, as required, and a necessary processing of operation is performed in accordance with an operation program by use of the measured data, thereby controlling the exhaust valve 11 through the I/O interface circuit. A change-over between the "LOCAL" mode and the "REMOTE" mode can be performed by making a change-over of a processing in conformity to the timing of abutment by the pushing mechanism 7.

In order to facilitate the understanding of the present invention, explanation will now be made of the pressure offset value.

The pressure offset means that a gas pressure in the processing chamber is further increased after push (or abutment) and sealing in order to optimize the shape of fused solder of the module or semiconductor package. In the following, the necessity of the pressure offset will be explained.

The profile of solidified solder fillet after sealing may be considered as resulting from the combination of a fillet profile at the time of abutment and a fillet fluctuation caused from a difference between pressures inside and outside the module in a cooling process after abutment and until the solidification of the solder. In practice, since there is no method of grasping and controlling the behavior of the solder in the cooling process after sealing, the result of a pressure control is judged on the basis of a solder fillet profile after sealing, and the result of the judgment is fed back to be reflected in a process condition.

As the result of study of the external appearance of the shape of solder after the sealing has been actually made under a condition including no pressure offset, it has been revealed (a) that the solder fillet exhibits an outwardly swollen profile in the case where a pressure control is made on the basis of only a gas pressure in the chamber and a temperature of a work (or the semiconductor package having the substrate and the cap applied with solder) at the time of sealing, and (b) that there is no exception from (a).

Further studying the external appearance after sealing on the basis of the above-mentioned concept about the module solder shape upon cooling, or in other words, examining the sealing process in more detail, the following is revealed:

(a') By push (or abutment) upon sealing, (1) fused solder bumps of the substrate 1 and the cap 2 contact or join with each other, (2) the interior and the exterior of the module are isolated by the fused solder bumps, and (3) the substrate 1 and the cap 2 are pushed against each other until the substrate and the cap abut. In the course from (2) to (3), a gas pressure in the module is increased to swell the fillet toward the outside.

(b') In the case of sealing under a condition including no pressure offset, the influence of the module cooling process on the fillet profile does not substantially include an effect of visibly indenting the solder.

From the foregoing, it has been found out that a pressure offset for indentation of the fillet or an increase of a gas pressure in the chamber after the filling or supply of the inert (or helium) gas jig is indispensable for optimizing the shape of the solder at the bonding portions after sealing. A pressure $P_1$ in the module at this time is $$P_1 = (P_0 + \Delta P)(T_1 + 273)/(T_0 + 273), \quad (3)$$

as represented by the equation (3) which has already been shown.

Figure 6A:
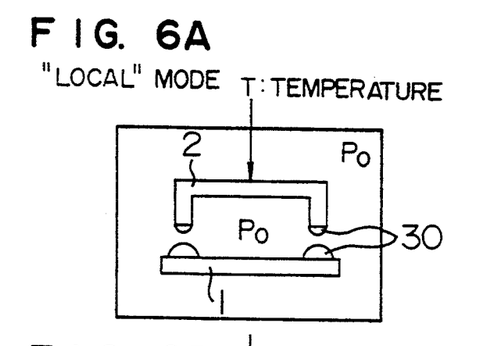
FIGS. 6A to 6H are views for explaining an example of a sealing process according to the present invention.
Figure 6B:
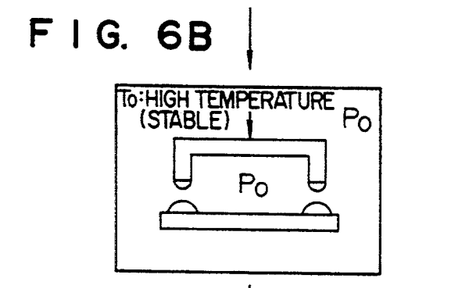
Figure 6C:
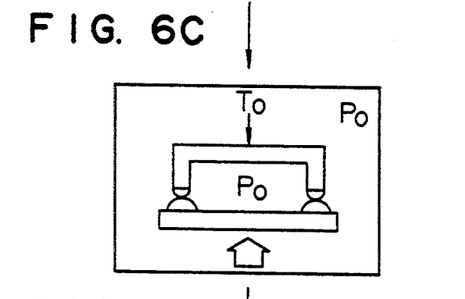
Figure 6D:
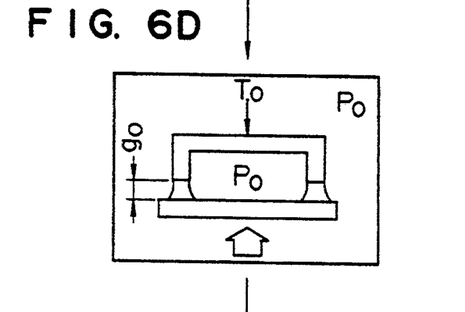
Figure 6E:
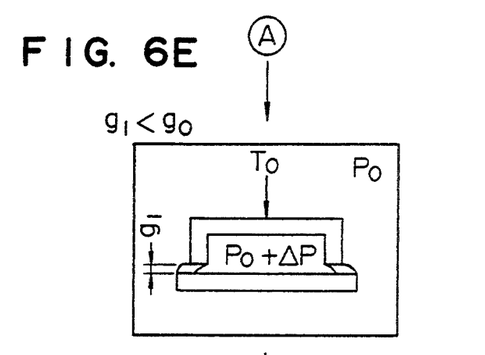
Figure 6F:
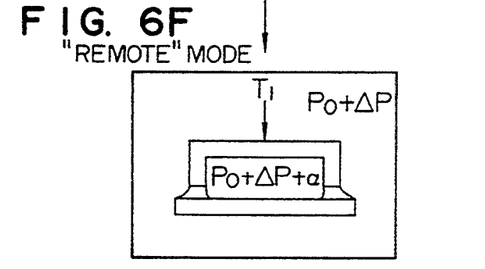
Figure 6G:
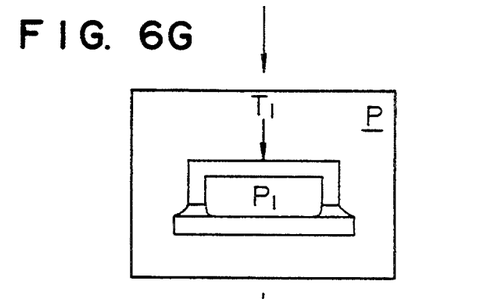

FIGS. 6A to 6H are diagrams for explaining the outline of a process. In FIG. 6A, a work provided with a semiconductor package including a substrate 1, a cap 2 and solder bumps 30 is set. In FIG. 6B, the work is heated so that the solder bumps are fused. A gas pressure in a chamber is adjusted. In FIG. 6C, the substrate 1 is pushed against the cap 2. In FIG. 6D, the fused solder bumps 30 contact or join with each other so that the interior and the exterior of the semiconductor package including the substrate 1 and the cap 2 are isolated from each other. In FIG. 6E, the substrate 1 is completely pushed up to abut against the cap 2 so that a predetermined distance $g_1$ ($<g_0$) is kept between the substrate 1 and the cap 2. A portion having a lack of solder 30 exists beneath the cap 2. Namely, the shape of solder is not proper. Between the step shown in FIG. 6E and a step shown in FIG. 6F, a change-over from the "LOCAL" mode to the "REMOTE" mode is made. In FIG. 6F, a pressure offset $\Delta P$ is applied so that the solder is shaped into a proper profile. In FIG. 6F, $\alpha$ represents an increment in a gas pressure in the work which is caused from the pressure offset of solder by $\Delta P$. Usually, since the ratio of the amount of solder to the internal volume of the work is very small, $\alpha$ is ignored. In FIG. 6G, the work is cooled. An estimated gas pressure $P_1$ in the work is determined by $$P_1 = (P_0 + \Delta P)(T_1 + 273)/(T_0 + 273). \quad (3)$$

Figure 6H:
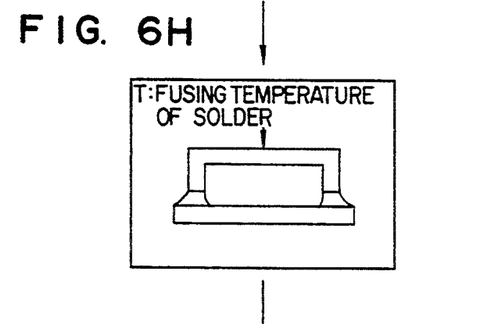

A gas pressure P in the chamber is controlled so that P becomes equal to $P_1$. In FIG. 6H, the pressure control is completed at a stage of time when the work has been cooled until a temperature at which the solder solidifies.

As has already been explained in the specification, $\Delta P$ is the pressure offset value. The pressure offset value $\Delta P$ can be considered to be a value corresponding to the internal pressure of fused solder. Also, for example, the pressure offset value $\Delta P$ can be considered to substantially correspond to an increment of a gas pressure in the package calculated on the assumption that solder encounters no deformation in the case where the distance between the substrate 1 and the cap 2 is decreased from $g_0$ to $g_1$.

Figure 7:
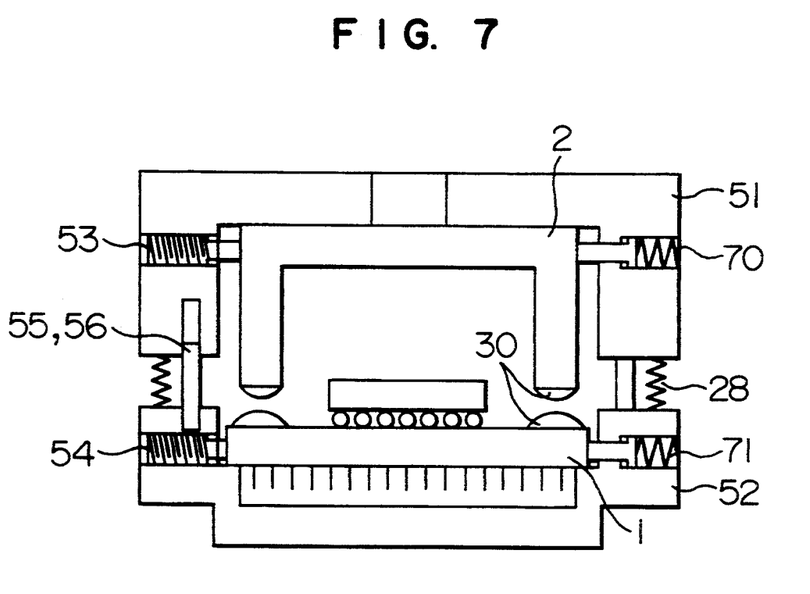
FIG. 7 is a view showing an example of a jig used in the present invention.

FIG. 7 shows an embodiment in which a lower heater is fixed in a processing chamber, an upper heater is movable in an upward direction and a jig having a work set therein is carried. The jig is divided into an upper jig 51 and a lower jig 52. The jigs 51 and 52 have fixing screws 53 and 54 which are provided for positioning and fixing a cap 2 and a substrate 1, and a positioning or dowel pin 55 and a positioning or dowel hole 56 which are provided for preventing a positional deviation of bonding portions of the cap 2 and the substrate 1 when the upper and lower jigs are combined. Since it is necessary to maintain a distance between the bonding portions of the cap 2 and the substrate 1 during a time when solder bumps 30 on the bonding portions of the cap 2 and the substrate 1 are heated up to a predetermined fusing point of solder, springs 28 are embedded in the jigs.

The cap 2 is fixed by a fixing mechanism (or the fixing screw 53 in FIG. 7) to the upper jig 51 at a predetermined position with respect to the positioning pin 55 or hole 56. In this case, it is preferable that push springs such as plungers 70 are provided against two adjacent ones of four sides, taking the expansion of the jig 51 upon heating into consideration.

Similarly, the substrate 1 is fixed to the lower jig 52 at a predetermined position with respect to the positioning or dowel hole 56 or pin 55. In this case too, it is preferable that the fixing is made using the fixing screw 54 and push springs such as plungers 71, which are provided corresponding to those used in conjunction with the upper jig 51.

The upper and lower jigs 51 and 52 are positioned by pin doweling and are set in the lower heater 5. Thereafter, the upper heater 6 is set and a predetermined processing is performed. It is preferable that the lower and upper heaters 5 and 6 take a structure in which the reduction of a contact resistance is contemplated by a spring load or a pushing pressure using hydraulic or pneumatic pressure.

Figure 8:
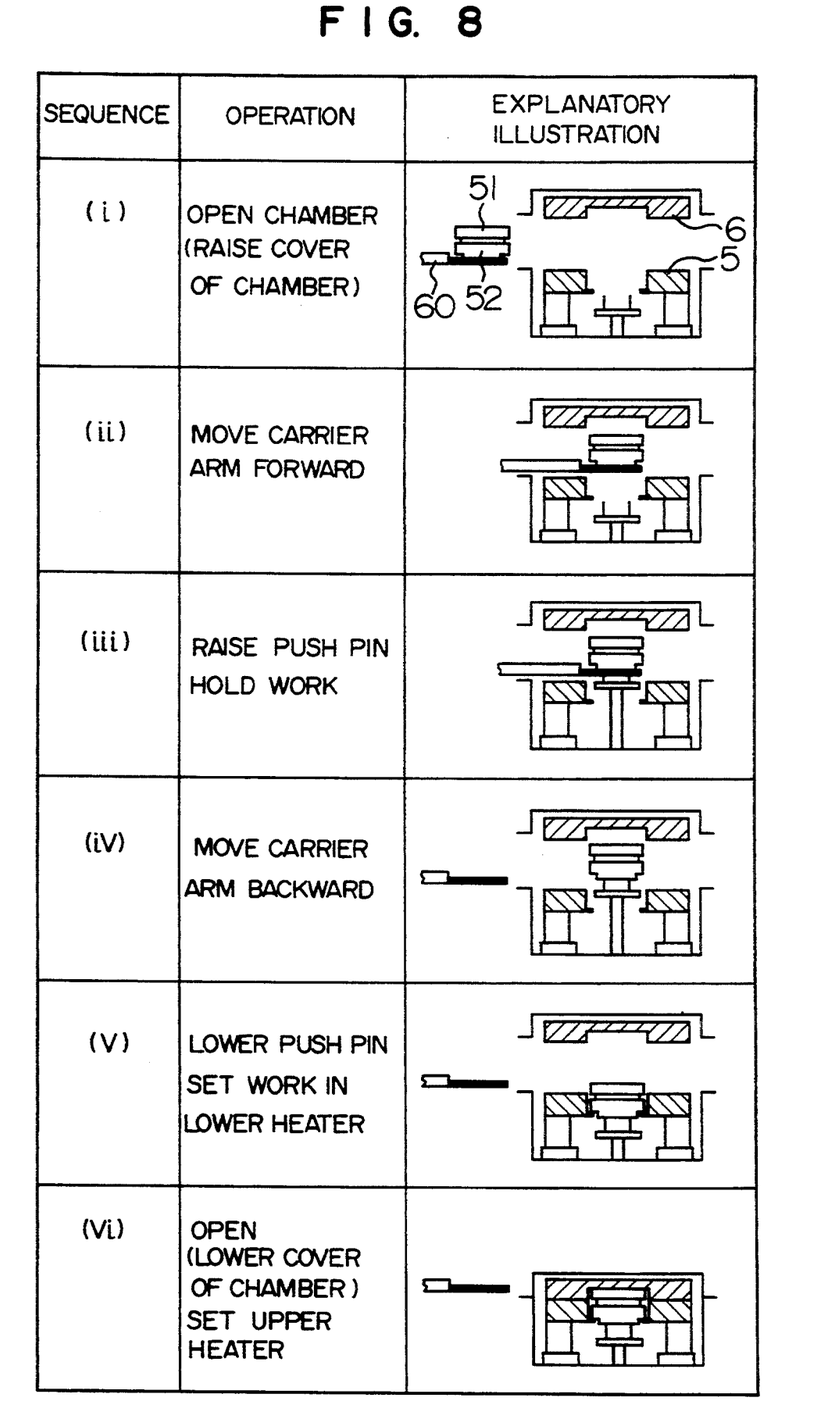
FIG. 8 is a diagram for explaining an example of an operation for carry-in of the jig used in the present invention.

FIG. 8 shows an example in which the works or jigs 51 and 52 shown in FIG. 7 are carried by use of a carrier arm 60.

Figure 9:
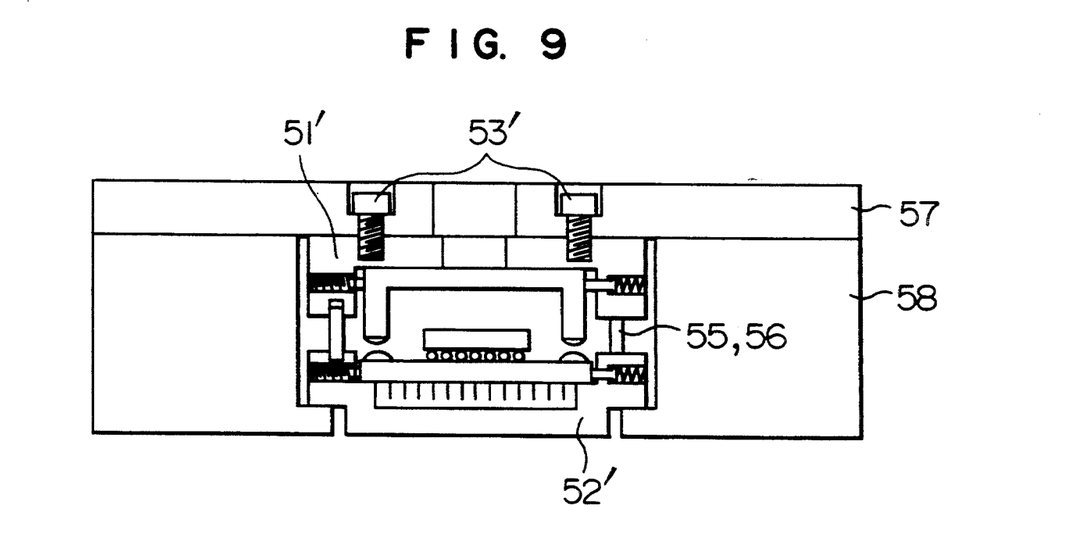
FIG. 9 is a view showing an example of a jig which is united with heaters in a body.

FIG. 9 shows an embodiment in which upper and lower heaters 57 and 58 including jigs 51' and 52' having a work fixed therein are carried. In the present embodiment, since a structure is possible in which the upper jig 51' is fixed to the upper heater 57, for example, by fixing screws 53', it is not required that springs for maintaining a distance between bonding portions, as used in the embodiment shown in FIG. 7, are provided between the upper and lower jigs.

I claim:

1. A method of hermetically sealing a semiconductor package, comprising the steps of:

carrying a work into a chamber, said work being provided with a semiconductor package which includes a substrate with solder and a cap with solder;

introducing a gas into said chamber and heating said work to fuse said solders and to make a gas pressure in said chamber and a temperature of said work initial target values $P_0$ and $T_0$, respectively;

joining the solder of said substrate and the solder of said cap with a distance between said substrate and said cap being kept at a first value $g_0$;

decreasing a distance between said substrate and said cap to a second value $g_1$ from said first value $g_0$;

increasing the gas pressure $P_0$ in said chamber to a second target value $P = P_0 + \Delta P$ to modify the deformation of solder caused by the decrease of the distance between said substrate and said cap from said first value $g_0$ to said second value $g_1$, where $\Delta P$ is a pressure offset value representing an increase in the semiconductor package internal gas pressure due to said decreasing step; and cooling said work, including sequentially adjusting the gas pressure in said chamber in accordance with the temperature of said work.

2. A method according to claim 1, wherein said cooling step includes successively adjusting a gas pressure in said chamber to a target value of $$P_1 = C(P_0 + \Delta P)(T_1 + 273)/(T_0 + 273)$$

where $T_1$ is a temperature of said work, and C is a constant.

3. A method of hermetically sealing a semiconductor package, comprising, in a gas pressure-controlled processing chamber, the steps of:

enclosing a semiconductor package, including a substrate and a cap, by heating means and heating said semiconductor package by said heating means in a state in which bonding portions of said substrate separate from bonding portions of said cap;

bringing the bonding portions of said substrate and the bonding portions of said cap into abutment after a temperature of said semiconductor package has reached an initial target temperature equal to or higher than a fusing point of pre-solder applied on the bonding portions of said substrate and on the bonding portions of said cap; and controlling a gas pressure in said processing chamber and cooling said semiconductor package in the abutting state of said bonding portions, the control of the gas pressure in said processing chamber being made by successively measuring a temperature of said semiconductor package and determining a control target value of the gas pressure in said processing chamber based on the measured temperature.

4. A method according to claim 3, wherein the control target value of the gas pressure in said processing chamber is determined by use of a temperature of said semiconductor package successively measured after abutment of said bonding portions, and a temperature of said semiconductor package and a gas pressure in said processing chamber respectively measured before abutment of said bonding portions.

5. A method according to claim 3, wherein the control target value of the gas pressure in said processing chamber is determined by use of a temperature of said semiconductor package successively measured after abutment of said bonding portions, a temperature of said semiconductor package measured before abutment of said bonding portions, and a sum of a gas pressure in said processing chamber measured before abutment of said bonding portions and a pressure offset value for correction of the shape of solder at said bonding portions, said pressure offset value representing an increase in the semiconductor package internal gas pressure due to a decrease in the semiconductor package internal volume.

6. A method according to claim 3, wherein the control target value of the gas pressure in said processing chamber is determined by use, of a temperature of said semiconductor package successively measured after abutment of said bonding portions and a preset constant value which corresponds to the ratio of a gas pressure in said processing chamber measured before abutment of said bonding portions to a temperature of said semiconductor package measured before abutment of said bonding portions.

7. A method according to claim 3, wherein the control target value of the gas pressure in said processing chamber is determined by use of a temperature of said semiconductor package successively measured after abutment of said bonding portions and a preset constant value which corresponds to the ratio of a sum of a gas pressure in said processing chamber measured before abutment of said bonding portions and a pressure offset value for correction of the shape of solder at said bonding portions to a temperature of said semiconductor package measured before abutment of said bonding portions, said pressure offset value representing an increase in the semiconductor package internal gas pressure due to a decrease in the semiconductor package internal volume.

8. A method according to claim 1, wherein said work is heated with said work being set in a jig having a thermal conductivity sufficient for reducing an influence of a variation of a heating temperature of a heater on a temperature of said work.

9. A method according to claim 1, wherein said work is set in a divided jig which has a function of fixing said substrate and said cap to position said bonding portions of said substrate and said bonding portions of said cap for abutment thereof, a guide function for positioning upon abutment of said bonding portions after fusing of the solder and a function of maintaining a distance between said bonding portions at said first value $g_0$ until the time of abutment of said bonding portions.

10. A method of hermetically sealing a semiconductor package having a cap covering a substrate, comprising the steps of:
providing a gas pressure-controlled processing chamber;
bringing into abutment bonding portions of a substrate and bonding portions of a cap of a semiconductor package while applying heat uniformly to both said cap and said substrate until said cap is at a temperature equal to or higher than a fusing point of sealing solder applied to said bonding portions;
adjusting an internal gas pressure in said processing chamber to correct a shape of the sealing solder after abutment of said bonding portions; and
thereafter cooling said semiconductor package to a temperature equal to or lower than a solidifying point of the sealing solder.

11. An apparatus for hermetically sealing a semiconductor package by a method according to claim 3, comprising:
a processing chamber for a sealing process;
a mechanism for holding a substrate and a cap of a semiconductor package in said processing chamber in a state in which bonding portions of the substrate and the cap are separated from each other or in a state in which they abut against each other;
means enclosing said semiconductor package held by said holding mechanism for heating said semiconductor package;
means for controlling a heating temperature for said semiconductor package;
a temperature sensor for measuring a temperature of said semiconductor package held by said holding mechanism;
a pressure sensor for measuring a gas pressure in said processing chamber;
means for supplying and exhausting a gas into and from said processing chamber; and
means for adjusting the supply and exhaust of the gas by said gas supplying and exhausting means in accordance with the value of measurement by said temperature sensor and the value of measurement by said pressure sensor to control the gas pressure in said processing chamber.

12. A method of hermetically sealing a semiconductor package as claimed in claim 10, wherein the temperature to which the cap is heated in said step of applying heat is controlled to vary by no more than a constant value.

13. A method of hermetically sealing a semiconductor package as claimed in claim 10, wherein the adjusting step is performed so that the pressure inside the gas pressure-controlled processing chamber is increased by a pressure offset $\Delta P$ to correct the shape of the sealing solder.

14. A method of hermetically sealing a semiconductor package as claimed in claim 10, wherein the pressure inside the gas pressure-controlled processing chamber is controlled during said adjusting step to achieve a target value $P_1$ as a function of $T_0$ and $T_1$, wherein $T_0$ is the temperature to which the cap is heated during said step of applying heat, and $T_1$ is a target temperature of the cap during said adjusting step for achieving the target value $P_1$.

15. An apparatus for hermetically sealing a semiconductor package, comprising:
a chamber for accommodating therein a work provided with a semiconductor package which includes a substrate with solder and a cap with solder,
holding means for holding said substrate and said cap with a variable distance therebetween,
heating means for heating said work to fuse said solders,
a temperature sensor for measuring a temperature of said work,
gas supplying/exhausting means for supplying and exhausting a gas into and from said chamber, and
controlling means for controlling the supply and exhaust of the gas by said gas supplying/exhausting means in accordance with one of a gas pressure in said chamber and the temperature of said work,
wherein said substrate and said cap are held by said holding means at a gas pressure $P_0$ in said chamber and at a temperature $T_0$ of said work with a distance $g_0$ being kept between said substrate and said cap, the solder of said substrate and the solder of said cap are joined, said substrate and said cap are thereafter held by said holding means with a distance between said substrate and said cap being decreased from $g_0$ to $g_1$, the gas pressure $P_0$ in said chamber is thereafter increased to $P=P_0+\Delta P$ where $\Delta P$ is a pressure offset value, thereby modifying the deformation of solder caused by the decrease of the distance between said substrate and said cap from $g_0$ to $g_1$, and said work is thereafter cooled, whereby the hermetic sealing of said semiconductor package is completed.

16. An apparatus according to claim 15, wherein a gas pressure in said chamber is successively adjusted to a target value of $$P_1 = C(P_0 + \Delta P)(T_1 + 273)/(T_0 + 273)$$

by said gas supplying/exhausting means controlled by said controlling means during a time that said work is cooled, where C is constant and $T_1$ is a temperature of said work when said substrate and said cap are held at a distance $g_1$.

17. An apparatus for hermetically sealing a semiconductor package, comprising:
    means for introducing a gas into a chamber and means for heating a work residing in said chamber, wherein said work is provided with a semiconductor package which includes a substrate with solder and a cap with solder, and said heating means heats said work to fuse said solder, said gas introducing means making a gas pressure in said chamber and said heating means making a temperature of said work to be at initial target values $P_0$ and $T_0$, respectively;
    means for joining the solder of said substrate and the solder of said cap with a distance between said substrate and said cap being kept at a first value $g_0$;
    means for decreasing the distance between said substrate and said cap to a second value $g_1$ from said first value $g_0$;
    means for controlling said gas introducing means to increase the gas pressure $P_0$ in said chamber to a second target value $P = P_0 + \Delta P$ to modify the deformation of solder caused by the decrease of the distance between said substrate and said cap from said first value $g_0$ to said second value $g_1$, where $\Delta P$ is a pressure offset value representing an increase in the semiconductor package internal volume due to decreasing the distance between said substrate and said cap by said decreasing means; and
    means for cooling said work and for sequentially adjusting the gas pressure in said chamber in accordance with the temperature of said work.

18. An apparatus as claimed in claim 17, further comprising:
    means for carrying the work into the chamber;
    the chamber into which the work is carried by said carrying means and into which the gas is introduced by said gas-introducing means;
    heating means for heating said work;
    a jig for supporting the work in the chamber, said jig having a thermal conductivity sufficient for reducing influence of a variation of temperature supplied by said heating means;
    means for controlling said heating means;
    a temperature sensor for measuring a temperature of a semiconductor package supported by said jig; and
    a pressure sensor for measuring a gas pressure within said chamber.

19. An apparatus as claimed in claim 17, wherein said cooling means includes means for successively adjusting a gas pressure within the chamber to a target value of $$P_1 = C(P_0 + \Delta P)(T_1 + 273)/(T_0 + 273),$$

wherein $T_1$ is a temperature of the work and C is a constant.

20. An apparatus as claimed in claim 17, further comprising:
    means for carrying the work into the chamber;
    the chamber into which the work is carried by said carrying means and into which the gas is introduced by said gas-introducing means;
    heating means for heating the work to fuse the substrate solder to the cap solder;
    a temperature sensor for measuring a temperature of the work; and
    means for exhausting the gas from the chamber, said controlling means further controlling the exhausting means in accordance with a gas pressure in said chamber.

21. An apparatus as claimed in claim 20, wherein the controlling means controls the gas pressure in the chamber to a target value of $$P_1 = C(P_0 + \Delta P)(T_1 + 273)/(T_0 + 273),$$

where C is a constant and $T_1$ is a temperature of the work when the substrate and the cap are separated by the distance $g_1$.

* * * * *